United States Patent
Nam et al.

(10) Patent No.: US 9,281,452 B2
(45) Date of Patent: Mar. 8, 2016

(54) METHOD FOR MANUFACTURING A CAN PACKAGE-TYPE OPTICAL DEVICE, AND OPTICAL DEVICE MANUFACTURED THEREBY

(71) Applicant: Point Engineering Co., Ltd., Asan-si, Chungcheongnam-do (KR)

(72) Inventors: Ki Myung Nam, Cheonan-si (KR); Seung Ho Park, Hwaseong-si (KR); Tae Hwan Song, Cheonan-si (KR)

(73) Assignee: Point Engineering Co., Ltd., Asan-si (KR)

( * ) Notice: Subject to any disclaimer, the term of this patent is extended or adjusted under 35 U.S.C. 154(b) by 0 days.

(21) Appl. No.: 14/349,226

(22) PCT Filed: Oct. 4, 2012

(86) PCT No.: PCT/KR2012/008051
§ 371 (c)(1),
(2) Date: Apr. 2, 2014

(87) PCT Pub. No.: WO2013/051869
PCT Pub. Date: Apr. 11, 2013

(65) Prior Publication Data
US 2015/0048408 A1 Feb. 19, 2015

(30) Foreign Application Priority Data

Oct. 5, 2011 (KR) .................. 10-2011-0101248

(51) Int. Cl.
| H01L 21/00 | (2006.01) |
| H01L 33/48 | (2010.01) |
| H01L 33/62 | (2010.01) |
| H01L 33/56 | (2010.01) |
| H01L 25/075 | (2006.01) |

(52) U.S. Cl.
CPC .............. *H01L 33/486* (2013.01); *H01L 33/56* (2013.01); *H01L 33/62* (2013.01); *H01L 25/0753* (2013.01); *H01L 2224/48091* (2013.01); *H01L 2933/005* (2013.01); *H01L 2933/0033* (2013.01); *H01L 2933/0066* (2013.01)

(58) Field of Classification Search
CPC ..................... H01L 2924/00; H01L 27/14687; H01L 27/14603; H01L 2924/00014; H01L 2224/48091; H01L 2224/48247; H01L 2924/1306
USPC .......................................... 438/26
See application file for complete search history.

(56) References Cited

U.S. PATENT DOCUMENTS 6,599,768 B1 * 7/2003 Chen .................. 438/22
2014/0295592 A1 * 10/2014 Chen et al. ............ 438/27

FOREIGN PATENT DOCUMENTS

| JP | 2003-303999 | 10/2003 | .............. H01L 33/00 |
| JP | 2004-119981 | 4/2004 | .............. H01L 33/00 |
| KR | 100593943 | 6/2006 | .............. H01L 33/00 |
| KR | 100616692 | 8/2006 | .............. H01L 33/00 |
| KR | 100714749 | 4/2007 | .............. H01L 33/00 |
| KR | 10-1021210 B1 | 1/2009 | .............. H01L 33/00 |
| KR | 1020090006790 | 1/2009 | .............. H01L 33/00 |

OTHER PUBLICATIONS

International Searching Authority, International Preliminary Report on Patentability—International Application No. PCT/KR2012/008051, dated Apr. 8, 2014, 6 pages.
International Searching Authority (English Translation), International Preliminary Report on Patentability—International Application No. PCT/KR2012/008051, dated Apr. 8, 2014, 9 pages.
International Search Report; PCT/KR2012/008051, 4 pages, Feb. 19, 2013.

* cited by examiner

*Primary Examiner* — Tony Tran
(74) *Attorney, Agent, or Firm* — Sunstein Kann Murphy & Timbers LLP

(57) ABSTRACT

The present invention relates to a method for manufacturing an optical device, and to an optical device manufactured thereby, which involve using a substrate itself as a heat-dissipating plate, and adopting a substrate with vertical insulation layers formed thereon, such that electrode terminals do not have to be extruded out from a sealed space, and thus enabling the overall structure and manufacturing process for an optical device to be simplified.

According to the present invention, a method for manufacturing a can package-type optical device comprises the steps of: (a) preparing a metal plate and a metal substrate with vertical insulation layers, wherein more than one vertical insulation layer crossing the substrate from the top surface to the bottom surface thereof are formed; (b) bonding the metal plate on the top surface of the metal substrate with vertical insulation layers; (c) forming a cavity on an intermediate product that has undergone step (b) in a form of a cylindrical pit having a predetermined depth reaching the surface of said metal substrate with vertical insulation layers by passing through said metal plate and the adhesive layers formed by said bonding, wherein said cavity contains said vertical insulation layer in the bottom wall thereof; (e) connecting a wire, which electrically connects an optical device and an electrode of the optical device together, to either side of the surface of the bottom wall of the vertical insulation layers of the cavity, respectively; and (g) sealing the cavity by means of a protective plate made from a light-transmitting material; and a can cap, formed as a picture frame whose top central portion and the bottom are open and encompassing the perimeter of the protective plate.

6 Claims, 8 Drawing Sheets

METHOD FOR MANUFACTURING A CAN PACKAGE-TYPE OPTICAL DEVICE, AND OPTICAL DEVICE MANUFACTURED THEREBY

TECHNICAL FIELD

The present invention relates to a method for manufacturing a can package-type optical device, and to an optical device manufactured thereby, more particularly, to a method for manufacturing a can package-type optical device and an optical device manufactured thereby, and thus enabling the structure for a can package-type optical device to be simplified

BACKGROUND ART

Generally, semiconductor light emitting diode (LED) receives attention from various fields as an environment friendly light source. Recently, as applications of LEDs are expanding to various fields such as interior and exterior illuminations, automobile headlights, and back-light units (BLU) of display devices, there are needs for high optical efficiency and excellent heat radiation characteristics. For high efficiency LEDs, materials or structures of the LEDs should be improved primarily, however there is a need for improvement in the structures of the LED packages and the materials used therein.

In such high efficiency LEDs, high temperature heat is produced, therefore this heat must be radiated effectively otherwise temperature rising on the LEDs causes ageing of the characteristics thereby shortening the lifetime. In high efficiency LED packages, efforts on effective radiation of the heat produced by the LEDs are making progress.

Hereinafter, any kind of device that emits light including LED will be referred to as 'optical device,' and any product including more than two optical devices will be referred to as 'optical device.'

Figure 1:
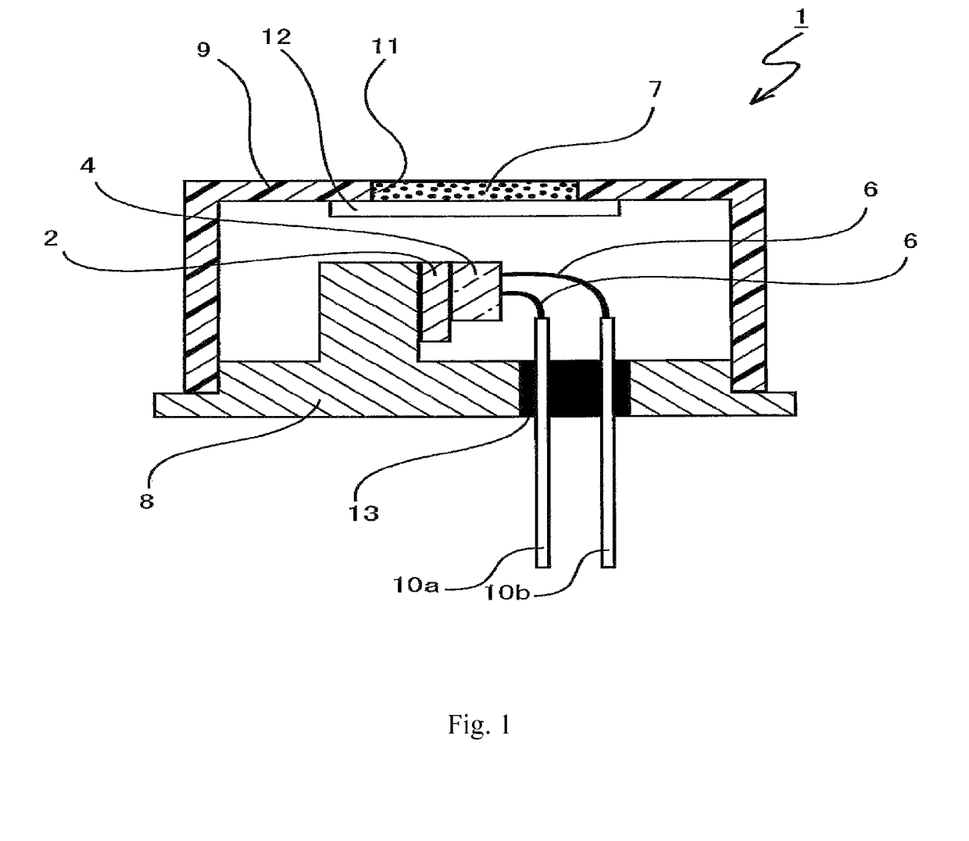
FIG. 1 is a cross-sectional view of an optical device according to an example of a can package-type of the prior art.

Meanwhile, UV light emitting diodes or short-wavelength visible light emitting laser diodes or the like are manufactured as a can package-type wherein inert gas, for example, nitrogen gas and the like is sealed; FIG. 1 is a cross-sectional view of an optical device according to an example of a can package-type of the prior art, and it is disclosed in Korea patent No. 1021210.

As shown in FIG. 1, in an optical device 1 inert gas is sealed in an airtight space configured by a metal stem 8 and a can cap 9, and the semiconductor light emitting element 4 is provided in the airtight space and is fixed to the metal stem 8 through a substrate 2.

A ceramic block 13 is fitted into an opening in the metal stem 8 wherein a pair of electrode terminals 10a and 10b are extended out of the airtight space through the ceramic block 13, and the electrode terminals 10a and 10b and the semiconductor light emitting element 4 are electrically coupled with each other by wires.

An opening 11 is formed on the upper face center of the can cap 9, and the opening 11 is sealed with a transparent plate 12 sealing inside of the can cap 9. A phosphor layer 7 is formed in the opening 11.

Peripheral portions of the metal stem 8 and the can cap are bonded by welding or the like, thereby forming an airtight space.

It is preferred that the metal stem 8 and the can cap 9 are made of the same material, for example, single metal material such as aluminum or cobalt, however, alloy such as cobalt or copper-tungsten may also be used. In the airtight space, the metal stem 8 supports the semiconductor light emitting element 4 and radiates heat generated by the semiconductor light emitting element 4 out of the airtight space. Thus, it is preferred that the metal stem 8 is made of a material having high thermal conductivity.

The inert gas sealed into the airtight space is, for example, at least one inert gas of nitrogen, helium, or argon, thereby preventing the semiconductor light emitting element 4 from being deteriorated.

The ceramic block 13 is a non-conductive member such as, for example, alumna or aluminum nitride, which is fitted and fixed to an opening formed in the metal stem 8, thereby electrically insulating the electrode terminals 10a and 10b from the metal stem 8. The semiconductor light emitting element 4 is fixed to the substrate 2 by solder or the like, and the substrate 2 is fixed to the metal stem 8 by solder or the like.

The electrode terminals 10a and 10b are comprised of conductive materials, for example, they may be formed by a punching process of a metal plate. The transparent plate 12 is a sheet-shaped member made of a transparent material such as glass and resin, and may be a convex shape or a concave shape to provide a lens effect.

According to the foregoing can package-type optical device of the prior art, since the metal stem merely supports the semiconductor light emitting element, for applying power to the semiconductor light emitting element, two electrical terminals penetrating said airtight space and a ceramic block 13 and the like are required, thereby resulting problems of complicated structure and difficult manufacturing process. Besides, there is a problem of degradation in reflection efficiency and heat dissipation capability.

SUMMARY OF INVENTION

Technical Problem

An objective of the present invention, devised to solve above described problems, is to provide a method for manufacturing an optical device, and to an optical device manufactured thereby, which involve using a substrate itself as a heat-dissipating plate, and adopting a substrate with vertical insulation layers formed thereon, such that electrode terminals do not have to be extruded out from a sealed space, and thus enabling the overall structure and manufacturing process for an optical device to be simplified.

Solution to Problem

According to the first feature of the present invention, a method for manufacturing a substrate for a can package-type optical device is provided, and said method includes the steps of: (a) preparing a metal plate and a metal substrate with vertical insulation layers, wherein more than one vertical insulation layer crossing said substrate from the top surface to the bottom surface thereof are formed; (b) bonding said metal plate on the top surface of said metal substrate with vertical insulation layers; (c) forming a cavity on an intermediate product that has undergone step (b) in a form of a cylindrical pit having a predetermined depth reaching the surface of said metal substrate with vertical insulation layers by passing through said metal plate and the adhesive layers formed by said bonding, wherein said cavity contains said vertical insulation layer in the bottom wall thereof.

In above described first feature, said step (b) may include an adhesive film interposed therein. It may further include step (d) forming a metal plated layer at least on the main wall and on the top surface of said cavity excluding said adhesive layer of said intermediate product that has undergone said step (c)

According to the second feature of the present invention, a substrate for a can package-type optical device manufactured in accordance with the above described first feature is provided.

According to the third feature of the present invention, a method for manufacturing a can package-type optical device is provided, and said method includes the steps of: (a) preparing a metal plate and a metal substrate with vertical insulation layers, wherein more than one vertical insulation layer crossing said substrate from the top surface to the bottom surface thereof are formed; (b) bonding said metal plate on the top surface of said metal substrate with vertical insulation layers; (c) forming a cavity on an intermediate product that has undergone step (b) in a form of a cylindrical pit having a predetermined depth reaching the surface of said metal substrate with vertical insulation layers by passing through said metal plate and the adhesive layers formed by said bonding, wherein said cavity contains said vertical insulation layer in the bottom wall thereof; (e) connecting wires, electrically connected to said optical device and an electrode of said optical device, to one side and the other side with respect to said vertical insulation layer of the bottom wall of said cavity, respectively; and (g) sealing said cavity by means of a protective plate made from a light-transmitting material, and a can cap formed as a picture frame whose top central portion and the bottom are open and encompassing the perimeter of said protective plate.

In above described third feature, said step (b) may include an adhesive film interposed therein. It may further include a step (d) for forming a metal plated layer at least on the main wall and on the top surface of said cavity excluding said adhesive layer of said intermediate product that has undergone step (c). It may further include a step for charging inert gas inside of said cavity before or after said step (f).

According to the fourth feature of the present invention, a can package-type optical device manufactured in accordance with the above described third feature is provided According to the fifth feature of the present invention, a method for manufacturing a substrate for a can package-type optical device is provided, and said method includes the steps of: (h) preparing a metal plate having more than one hole that will be functioning as a cavity, and metal substrate with vertical insulation layers, wherein more than one vertical insulation layer crossing the substrate from the top surface to the bottom surface thereof are formed; and (i) bonding said metal plate and said metal substrate with vertical insulation layers wherein the bottom wall of said cavity includes said vertical insulation layers.

In above described fifth feature, said step (i) may include an adhesive film interposed therein. It may further include step (j) forming a metal plated layer at least on the main wall and on the top surface of said cavity excluding said adhesive layer of said intermediate product that has undergone said step (i)

According to the sixth feature of the present invention, a substrate for a can package-type optical device manufactured in accordance with the above described fifth feature is provided According to the seventh feature of the present invention, a method for manufacturing a can package-type optical device is provided, and said method includes the steps of: (h) preparing a metal plate having more than one hole that will be functioning as a cavity, and metal substrate with vertical insulation layers, wherein more than one vertical insulation layer crossing the substrate from the top surface to the bottom surface thereof are formed; (i) bonding said metal plate and said metal substrate with vertical insulation layers wherein the bottom wall of said cavity includes said vertical insulation layers; (k) connecting wires, electrically connected to said optical device and an electrode of said optical device, to one side and the other side with respect to said vertical insulation layer of the bottom wall of said cavity, respectively; and (g) sealing said cavity by means of a protective plate made from a light-transmitting material; and a can cap, formed as a picture frame whose top central portion and the bottom are open and encompassing the perimeter of the protective plate.

In above described seventh feature, said step (i) may include an adhesive film interposed therein. It may further include step (j) forming a metal plated layer at least on the main wall and on the top surface of said cavity excluding said adhesive layer of said intermediate product that has undergone said step (i) It may further include a step for charging inert gas inside of said cavity before or after said step (l).

According to the eighth feature of the present invention, a substrate for a can package-type optical device manufactured in accordance with the above described seventh feature is provided.

Advantageous Effects of Invention

According to a method for manufacturing an optical device, and to an optical device manufactured thereby, a substrate itself is utilized as a heat-dissipating plate, and by adopting a substrate with vertical insulation layers formed thereon, electrode terminals do not have to be extruded out from a sealed space, and thus the overall structure and manufacturing process for an optical device can be simplified.

DESCRIPTION OF EMBODIMENTS

Figure 2:
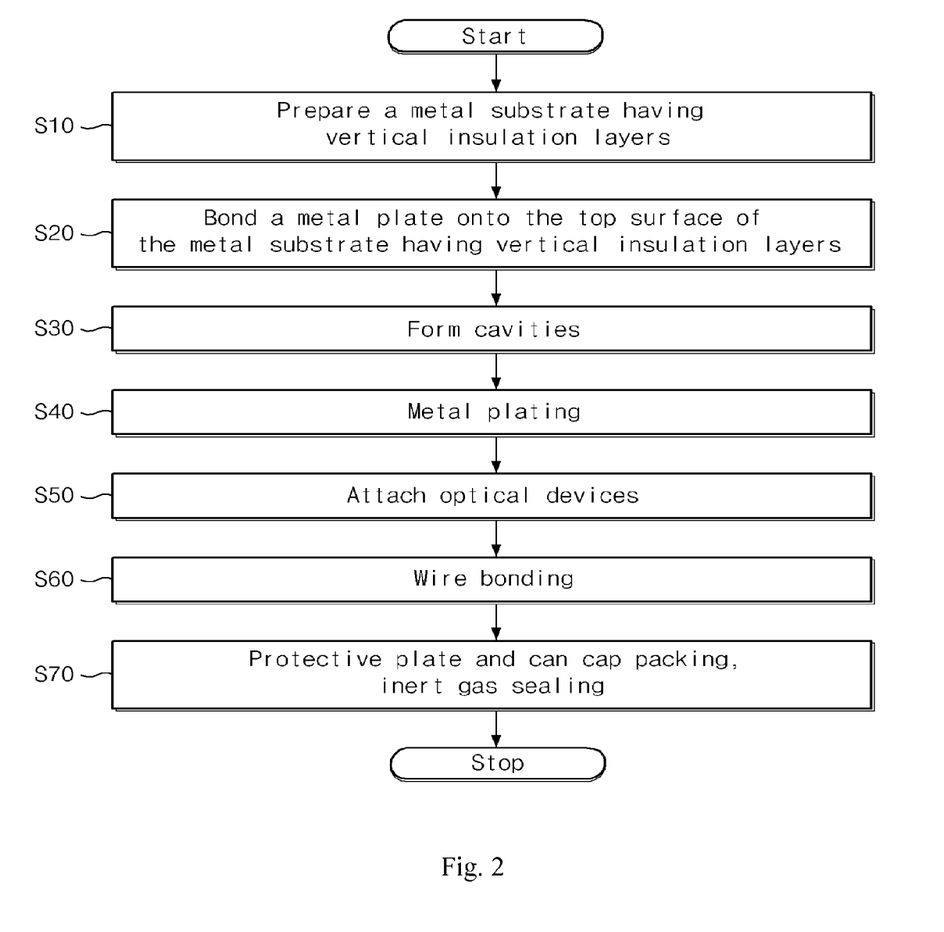
FIG. 2 is a process flow diagram to describe a manufacturing method for a can package-type optical device according to an exemplary embodiment of the present invention.
Figure 3:
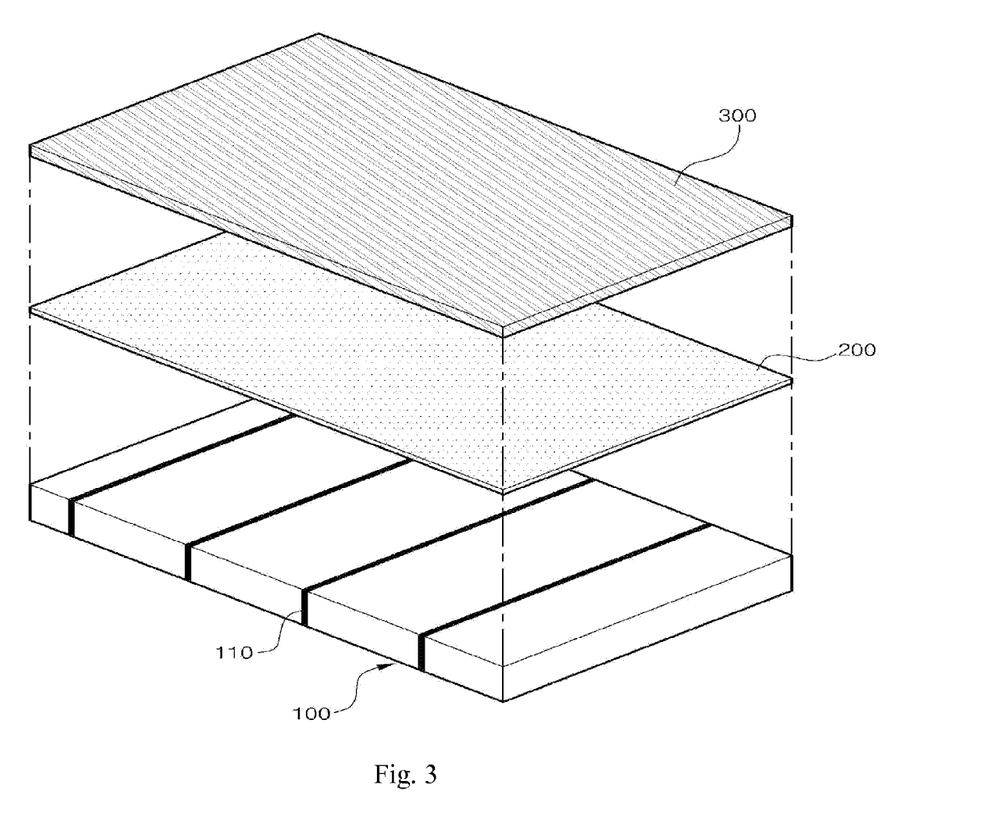
FIGS. 3 to 7 are perspective views or cross-sectional views at each corresponding step of the manufacturing method in FIG. 2.
Figure 4:
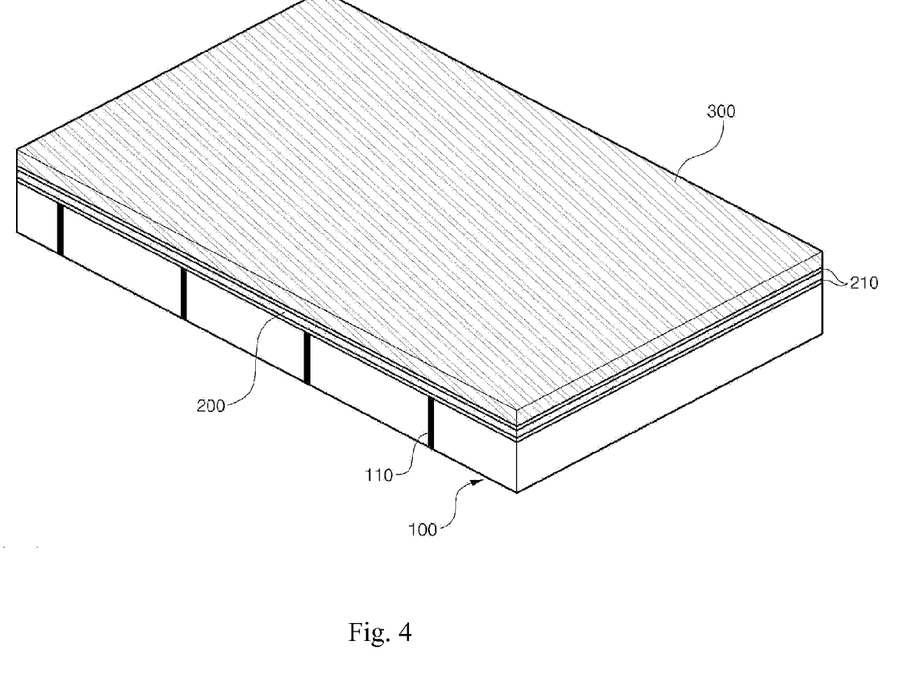
Figure 5:
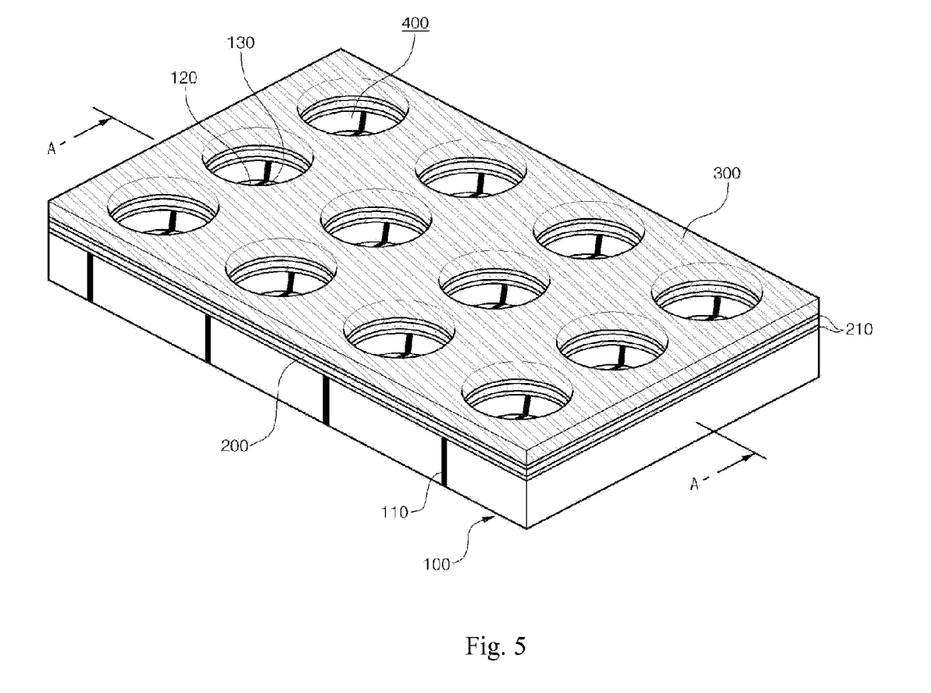
Figure 6:
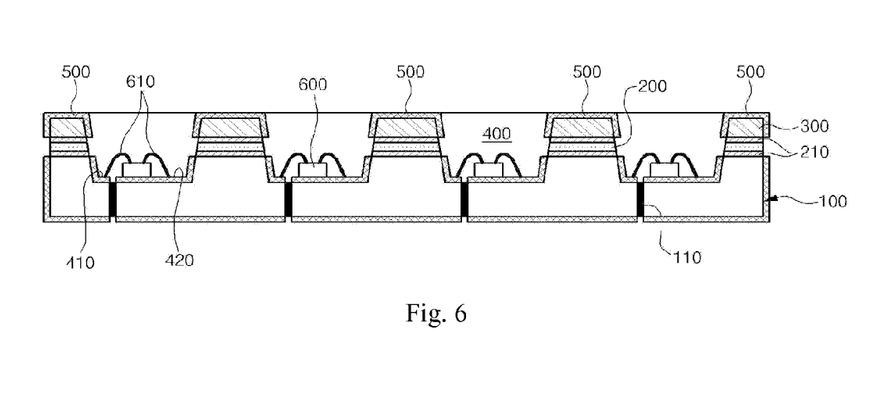
Figure 7:
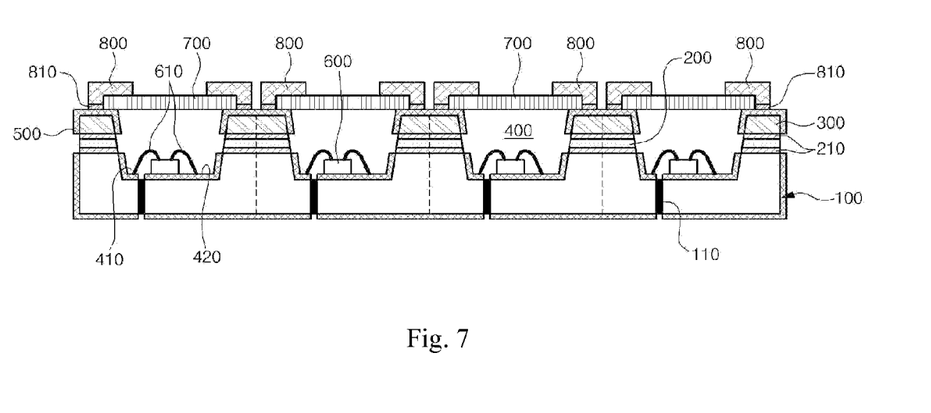

Hereinafter, a preferred exemplary embodiment of the present invention, a manufacturing method for a can package-type optical device, and an optical device manufactured thereby, will be described in detail with reference to the accompanying drawings FIG. 2 is a process flow diagram to describe a manufacturing method for a can package-type optical device of the present invention, and FIGS. 3 to 7 are perspective views or cross-sectional views to describe the manufacturing method for a can package-type optical device of the present invention, and FIGS. 6 and 7 are cross-sectional view along the line A-A in FIG. 5.

First, in step S10 in FIG. 2, as shown in FIG. 3, a metal substrate with vertical insulation layers 100 is prepared where more than one vertical insulation layer 110 crossing the substrate from the top surface to the bottom surface thereof are formed; and a metal plate 300 which will be bonded later to such metal substrate with vertical insulation layers 100 is prepared.

Here the metal substrate with vertical insulation layers 100 may be formed, for example, by stacking (or forming) the metal substrates alternately with the insulation layers and cutting it from top to bottom with a predetermined length (width), and there is no limitation in making such a metal substrate with vertical insulation layers 100.

As a material for such a metal substrate with vertical insulation layers 100, aluminum or copper, or an alloy containing more than one of them having excellent heat conductivity and electrical conductivity may be used.

The vertical insulation layer 110 for an aluminum substrate may be formed by anodizing the surface thereof, or unlike this, it may be realized with an insulation film made of synthetic resins. As a material for a metal plate 300, a metallic material of an excellent weldability, for example, aluminum, copper or iron, or an alloy containing more than one of them may be used.

Next, in step S20, as illustrated in FIG. 4, a metal plate 300 is bonded using a liquid adhesive 210 on the top surface of the metal substrate with vertical insulation layers 100, and bonding may be performed with an interposed adhesive film 200 made of synthetic resins to increase bonding strength.

At this moment, to increase bonding strength further, bonding process may be performed in a high temperature high pressure chamber (room) where higher temperature and pressure than normal temperature and pressure can be maintained; in addition to this, bonding process may be performed after mechanically or chemically creating roughness on the bonding surface of the metal substrate with vertical insulation layers 100, i.e. upper surface, and on the bonding surface of the metal plate 300, i.e. bottom surface.

When the metal substrate with vertical insulation layers 100 and the metal plate 300 are especially made of aluminum-based materials, each bonding surface thereof may be anodized prior to bonding process to increase bonding strength, and above described roughness may be introduced on such anodized surfaces.

Next, in step S30, in such an intermediate product, a cavity 400 in a form of a cylindrical pit having a predetermined depth reaching the metal substrate with vertical insulation layers 100 by passing through the metal plate 300 and the adhesive layers 200 and 210 as shown in FIG. 5, and such cavity 400 should be formed to contain a vertical insulation layer 110.

In this case, it is advantageous that the cavity 400 is being formed to have a downwardly narrowing taper for enhancing the reflection capability of the light, and it is advantageous that the larger area 130 with respect to the vertical insulation layer 110 located at center, where the optical device 600 is to be mounted, should be formed to have relatively larger area than the smaller area 120, where the wire is to be connected (hereinafter the region for wire connection is referred to as 'relatively smaller area 120' and the region for mounting the optical device is referred to as 'relatively larger area 130'). The cavity 400 may be formed by a mechanical process such as machining or a chemical process such as etching.

Next, in step S40, as shown in FIG. 6, for enhancing the reflection capability of the light generated from the optical device 600 or bonding characteristics, metal plating, for example silver (Ag) plating 500, is performed on the main wall and the upper wall of the cavity 400 or all over said intermediate product including the main wall and the upper wall of the cavity 400, and such metal plated layer 500 may be formed by electroplating and the like. In this case, in the adhesive layers 200 and 210, as illustrated, a metal plated layer 500 is not formed such that the top side and the bottom side with respect to the adhesive layers 200 and 210 are electrically insulated from each other.

Next, in step S50 and step S60, as shown in FIG. 6, an optical device 600 is attached on the relatively larger area 130 of the cavity 400, and the two electrodes of the optical device 600, i.e. one electrode from the cathode and the anode, for example, the anode electrode is connected to the relatively larger area 130 and the cathode electrode is connected to the relatively smaller area 120 through the wire 610. With the anode terminal (or cathode terminal) being formed to be exposed at the bottom surface of the optical device 600, when the optical device 600 and the relatively larger area 130 are bonded together by using bonding method that could maintain electrical conductivity, for example, soldering and the like, of course only a single wire, for example, a wire for connecting the cathode terminal of the optical device 600 and the relatively smaller area 120, will be needed.

Next, in step S70, as shown in FIG. 7, the internal space of the cavity 400 is packaged with a protective plate 700 and a can cap 800, and an inert gas is inserted inside; at this moment, the internal space of the cavity 400 can be sealed by welding the can cap 800 having the protective plate 700 being attached beforehand and the top surface of the cavity together using arc welding 810 and the like.

Unlike this, after inserting an inert gas inside of the cavity 400 the internal space of the cavity 400 may be sealed by using a protective plate 700, and then the can cap may be bonded using welding and the like; this process may be performed in an inert gas ambient.

Here the protective plate 700 may be made of a transparent glass, a synthetic resin material, or a synthetic resin material containing a phosphor layer, or the like; unlike this, a separate phosphor layer may be additionally disposed inside or outside of the protective plate 700 made of a transparent glass or a synthetic resin material.

The can cap 800 prevents the protective plate 700 from being separated, and it can be formed as a lid shape whose central area of the top surface and the entire bottom surface are open, i.e. a picture frame shape.

Meanwhile, the can package-type optical devices manufactured using such foregoing methods may be used as a single body itself, or may be used after separating it into one or more of rows or columns, or may be used after separating it into individual ones.

In this case, while the optical devices disposed in rows (horizontal lines) are connected in serial, the optical devices disposed in columns (vertical line) are connected in parallel.

According to an optical device manufactured in accordance with the exemplary embodiment of FIG. 2, since the metal substrate with vertical insulation layers 100 itself may be functioned as a heat dissipating plate and an external power can be applied to the optical device 600 through the metal substrate, therefore not only the structure but also the process can be simplified.

Figure 8:
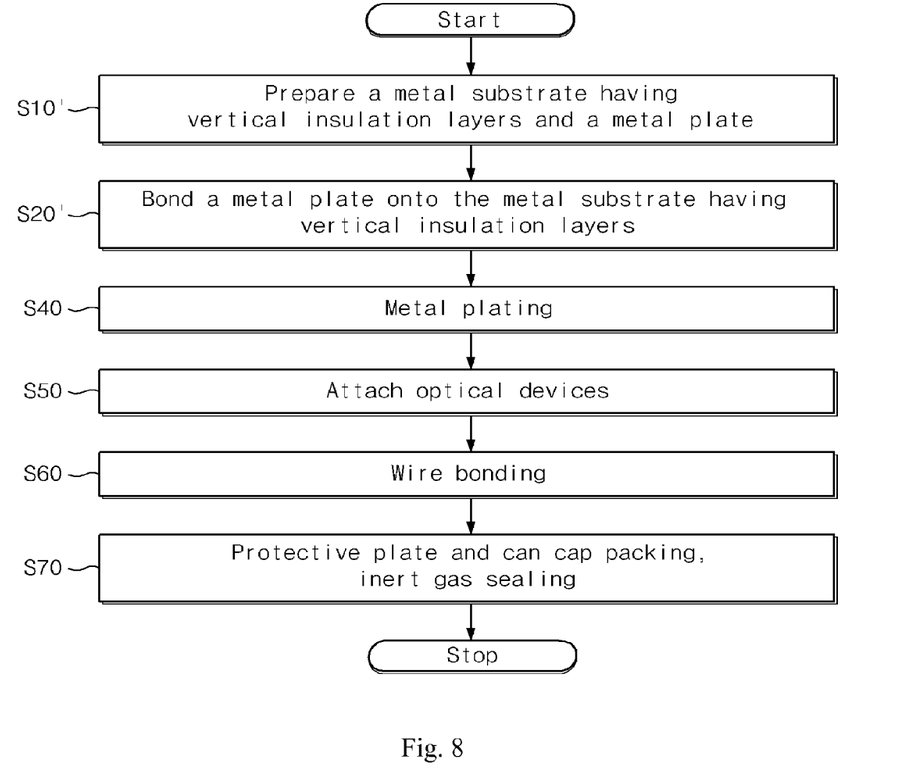
FIG. 8 is a process flow diagram to describe a manufacturing method for a can package-type optical device according to another exemplary embodiment of the present invention.
Figure 9:
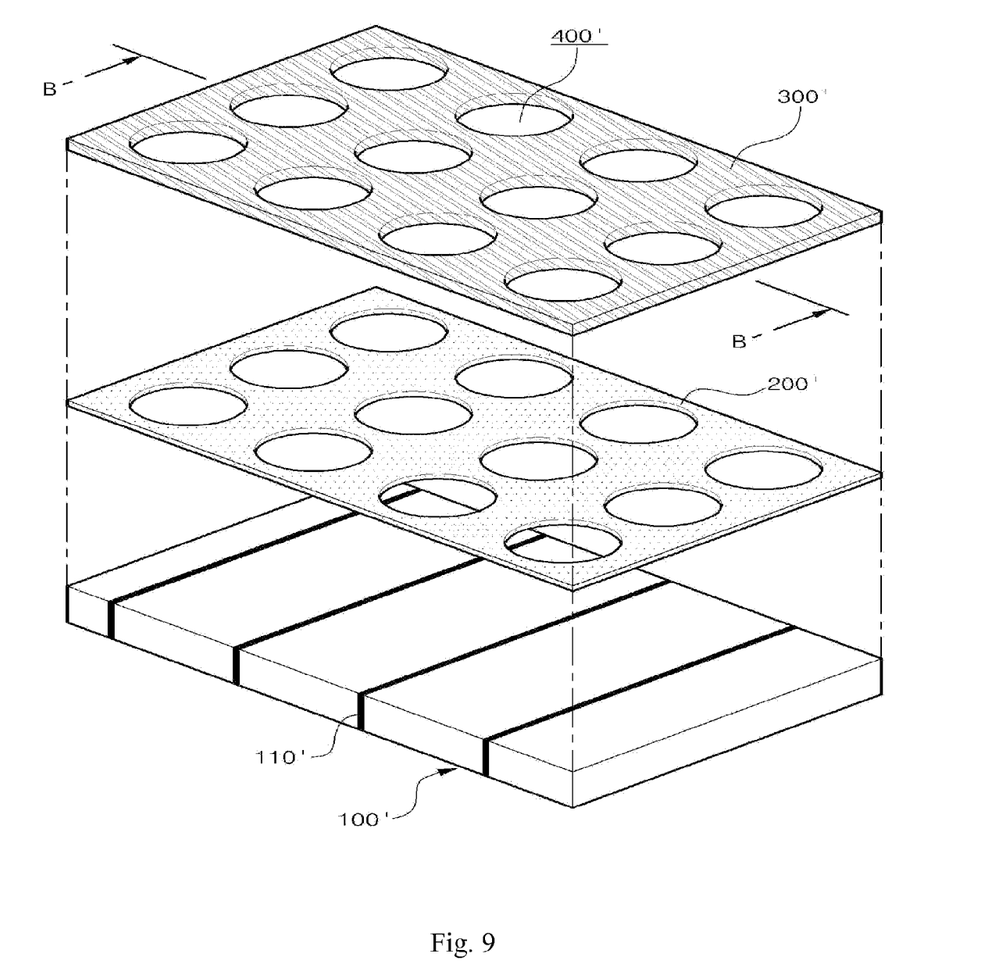
FIGS. 9 to 12 are perspective views or cross-sectional views at each step in FIG. 8.
Figure 10:
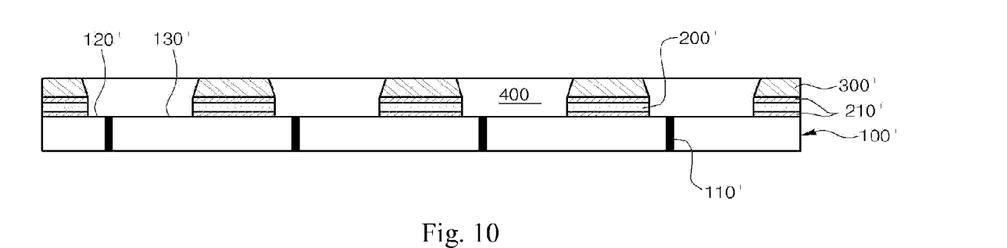
Figure 11:
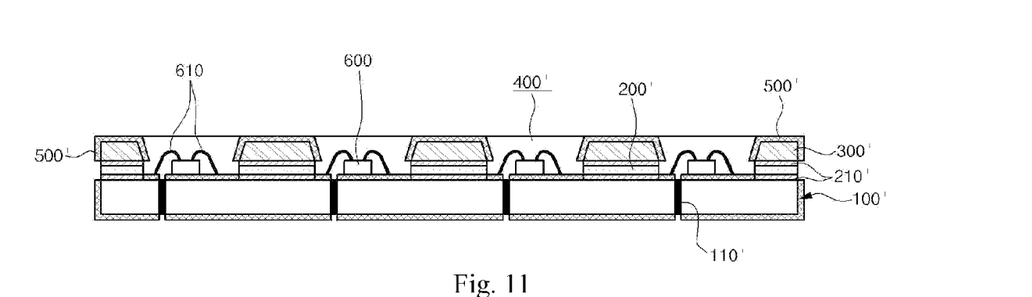
Figure 12:
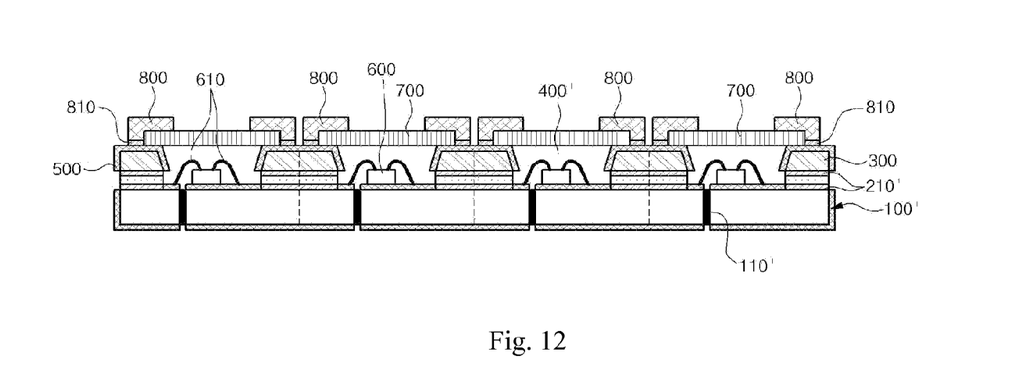

FIG. 8 is a process flow diagram to describe a manufacturing method for a can package-type optical device according to another exemplary embodiment of the present invention; FIGS. 9 to 12 are perspective views or cross-sectional views at each step in FIG. 8; same reference numbers are assigned for the corresponding elements in FIGS. 3 to 7, and their detailed descriptions are omitted. FIGS. 10 to 12 are cross-sectional views along the line B-B in FIG. 9.

The exemplary embodiment of FIG. 8 differs from the exemplary embodiment of FIG. 2 in that the cavity 400 is not machined while the metal plate 300 is being bonded to the metal substrate with vertical insulation layers 100, instead, a metal plate 300' where a cavity 400' is formed therein beforehand is bonded to the top surface of the metal substrate with vertical insulation layers 100'.

Although preparing a metal substrate with vertical insulation layers 100' in step S10' is same as (thickness can be adjusted) that of step S10 in FIG. 2, however, step S10' differs from step S10 in that the metal plate 300' where a cavity 400' is formed therein beforehand is prepared.

Here the cavity 400' may be formed using foregoing methods, and the shape may also be formed as described above. At this moment, the location where the cavity 400' is preferred to be decided such that the cavity 400' is divided into a relatively smaller area 120 and a relatively larger area 130 with respect to the metal substrate with vertical insulation layers 100' located at center when it is being bonded to the vertical insulation layer 110'.

Next, in step S20', as shown in FIG. 10, the metal substrate with vertical insulation layers 100' and the metal plate 300' having the cavity 400' formed therein beforehand are bonded together, and the liquid adhesive 210' or the adhesive film 200' used for bonding may be same as that of the exemplary embodiment of FIG. 2.

However, the adhesive film 200' will be formed such that the area facing the bottom of the cavity 400' of the metal plate 300' is opened. Since the subsequent processes are identical to those of the exemplary embodiment of FIG. 2, further detailed descriptions are omitted.

A method for manufacturing a can package-type optical device, and an optical device manufactured thereby of the present invention is not limited to the foregoing exemplary embodiments and various modifications can be made thereto without departing from the scope and spirit of the present invention. For example, the cross-section is illustrated as a circular shape in the foregoing exemplary embodiments; however, it may be realized as an elliptical shape, a rectangular shape, a square shape, or the like.

| Description of Symbols | |
|---|---|
| 100, 100': metal substrate with vertical insulation layers, | |
| 110: vertical insulation layer, | |
| 120': relatively small area, | 130: relatively large area, |
| 200, 200': adhesive film, | 210, 210': liquid adhesive, |
| 300, 300': metal film, | 400, 400': cavity, |
| 500, 500': metal plated layer, | 600: optical device, |
| 610: wire, | 700: protective plate, |
| 800: can cap, | 810: welding area |

What is claimed is:

1. A method for manufacturing a can package-type optical device including the steps of:

(a) preparing a metal plate;
(b) preparing a metal substrate having a bottom surface and an anodized top surface, and a plurality of vertical insulation layers crossing the substrate from the anodized top surface to the bottom surface;
(c) bonding said metal plate on the anodized top surface of said metal substrate;
(d) forming a cavity on an intermediate product that has undergone step (c) in a form of a pit having a side wall and a bottom wall, the pit having a depth reaching the anodized top surface of said metal substrate by passing through said metal plate and an adhesive layer formed by said bonding, the anodized top surface of the metal substrate defining the bottom wall of the cavity, wherein said cavity exposes one of said vertical insulation layers in the bottom wall thereof;
(f) connecting a first wire from an anode of an optical device to a first location on the wall of the cavity, and connecting a second wire from a cathode of the optical device to a second location on the wall of the cavity, the first location on the wall of the cavity isolated from the second location on the wall of the cavity by the exposed vertical insulation layer; and
(h) sealing said cavity by means of a protective plate made from a light-transmitting material, and a can cap formed as a picture frame whose top central portion and bottom are open and encompassing a perimeter of said protective plate.

2. The method for manufacturing a can package-type optical device of claim 1, being characterized in that
in said step (c), a bonding surface of said vertical insulation layer and a bonding surface of said metal plate are bonded after roughening thereof using a mechanical or a chemical method, and an adhesive film is interposed therebetween.

3. The method for manufacturing a can package-type optical device of claim 1, being characterized in that it further includes step (e) for forming a metal plated layer at least on the side wall and on the bottom wall of said cavity excluding said adhesive layer of said intermediate product that has undergone said step (d).

4. The method for manufacturing a can package-type optical device of claim 3, being characterized in that it further includes a step for charging inert gas inside of said cavity before or after said step (h).

5. The method for manufacturing a can package-type optical device of claim 1, being characterized in that it further includes a step for charging inert gas inside of said cavity before or after said step (h).

6. A can package-type optical device manufactured in accordance with claim 1.

* * * * *